United States Patent [19]

Levinson et al.

[11] Patent Number: 4,794,438
[45] Date of Patent: Dec. 27, 1988

[54] SEMICONDUCTOR RADIATION DETECTING DEVICE

[75] Inventors: Mark Levinson, Sudbury; Ben G. Yacobi, Natick; Brian M. Ditchek, Milford, all of Mass.

[73] Assignee: GTE Laboratories Incorporated, Waltham, Mass.

[21] Appl. No.: 26,313

[22] Filed: Mar. 16, 1987

[51] Int. Cl.$^4$ .................. H01L 27/14; H01L 29/48; H01J 40/14
[52] U.S. Cl. ........................................ 357/29; 357/30; 357/15; 357/59; 357/45; 357/60; 250/211 R
[58] Field of Search .................... 357/29, 30, 15, 59, 357/45, 60; 307/360, 361; 250/211 R, 332, 492.2

[56] References Cited

U.S. PATENT DOCUMENTS 3,765,956 10/1973 Li .............................................. 357/59
4,030,116 6/1977 Blumenfeld ............................ 357/60
4,544,939 10/1985 Kosonochy et al. .................. 357/15
4,695,861 9/1987 Paine et al. ............................ 357/30

Primary Examiner—Andrew J. James
Assistant Examiner—Donald J. Featherstone
Attorney, Agent, or Firm—David M. Keay

[57] ABSTRACT

A semiconductor radiation detector having a body which includes a matrix of semiconductor material, specifically silicon, having an array of individual rods of conductive material, specifically $TaSi_2$, disposed therein. The rods form Schottky barriers with the semiconductor material. A set of contacts spaced along the length of the body each make ohmic contact to several rods at one end of each rod, and an ohmic contact is made to the semiconductor material of the matrix. Incident radiation is directed at a surface of the body which lies parallel to the rods. Detectors connected to each of the contacts along the length of the body detect current flow generated in the vicinity of the rods associated with each contact member by radiation penetrating into the body to that depth.

28 Claims, 2 Drawing Sheets

SEMICONDUCTOR RADIATION DETECTING DEVICE

CROSS-REFERENCE TO RELATED APPLICATION

This application contains subject matter related to the subject matter in application Ser. No. 20,629, filed by Brian M. Ditchek, Mark Levinson, and Ben G. Yacobi entitled "Radiation Detecting Apparatus" and assigned to the assignee of the present application.

BACKGROUND OF THE INVENTION

This invention relates to apparatus for detecting incident radiation. More particularly, it is concerned with semiconductor radiation detecting devices.

In conventional semiconductor radiation detecting devices the electric field generated by a rectifying junction is used to separate and to collect the charge carriers (electrons or holes) produced in the semiconductor material by the absorption of incident radiation. This action requires that the radiation be absorbed by the semiconductor material at or near the junction, so that the electrons or holes can diffuse to it and be collected before encountering a recombination center in the semiconductor crystal. In conventional semiconductor devices the junction is parallel to and at a fixed depth below the surface which receives the radiation. Thus, the efficiency of conventional devices varies depending upon the depth of penetration of the radiation with respect to the depth of the junction. The semiconductor material of devices for detecting radiation with large penetration depths, such as high energy particles, x-rays, and gamma rays, must be prepared with extremely low impurity concentrations so that the depletion region of the junction extends to sufficient depth. In addition, conventional devices do not readily provide for distinguishing between different types of radiation nor for measuring their energies.

SUMMARY OF THE INVENTION

An improved radiation detecting devices in accordance with the present invention comprises a body including a matrix of semiconductor material having disposed therein an array of individual rods of conductive material forming rectifying barriers at the interfaces of the rods and the semiconductor material. The device includes a set of first conductive contact members at a first surface of the body. Each of the first conductive contact members is in ohmic contact with a different plurality of the rods at one end of each of the rods of its associated plurality. A second conductive contact member is in ommic contact with the semiconductor material of the matrix. The body is adapted to receive incident radiation at a portion of a second surface which lies generally transverse to the first surface. Incident radiation penetrates into the body and charge carriers produced by the absorption of radiation are collected at the rectifying barriers of rods of certain of the pluralities depending upon the depth of penetration of the radiation into the body.

In another aspect of the invention radiation detecting apparatus comprises a body including a matrix of semiconductor material having disposed therein an array of individual rods of conductive material forming rectifying barriers at the interfaces of the rods and the semiconductor material. The apparatus includes a set of first conductive contact members at a first surface of the body. Each of the first conductive contact members is in ohmic contact with a different plurality of the rods at one end of each of the rods of its associated plurality. A second conductive contact member is in ohmic contact with the semiconductor material of the matrix. The body has a second surface generally transverse to the first surface which is adapted to receive incident radiation so that charge carriers are produced by the absorption of radiation in the body and are collected at the rectifying barriers of adjacent rods. The apparatus also includes a set of current detecting means, each of which is connected to a different one of the set of first conductive contact members. All of the current detecting means are connected to the second conductive contact member. Each current detecting means detects the flow of electrical current generated by the collection of charge carriers at the rectifying barriers of the plurality of rods in contact with the first conductive contact member to which the current detecting means is connected.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION

Radiation detecting apparatus in accordance with the present invention employs a radiation detecting device fabricated from a body of semiconductor material containing an array of conductive rods which form rectifying barriers with the semiconductor material. In producing the bodies in which the devices of the present invention are to be fabricated, a charge containing the constituents of a eutectic composition of a semiconductor material and a conductive material is prepared. Any of several eutectic systems may be utilized in which the semiconductor phase is the matrix phase and the conductive material is the minor phase. These systems may be, for example, of the form Ge-MGe$_2$ Si-MSi$_2$, and GaAs-MAs, where M is a metal. It is desirable that the semiconductor material of the system have an absorption coefficient of incident radiation between $10^6$ cm$^{-1}$ and 0.5 cm$^{-1}$.

A charge containing the constituents in proper proportions to the eutectic composition of the semiconductor material and the conductive compound is melted in a suitable crucible and solidified unidirectionally employing well-known Czochralski crystal pulling techniques. A boule consisting of a composite of the semiconductor material and the conductive material that forms a eutectic with the semiconductor material is produced. The semiconductor material is in the form a a single crystal matrix with rods of the conductive material embedded in the matrix. The rods extend generally parallel to the direction of pulling.

Figure 1:
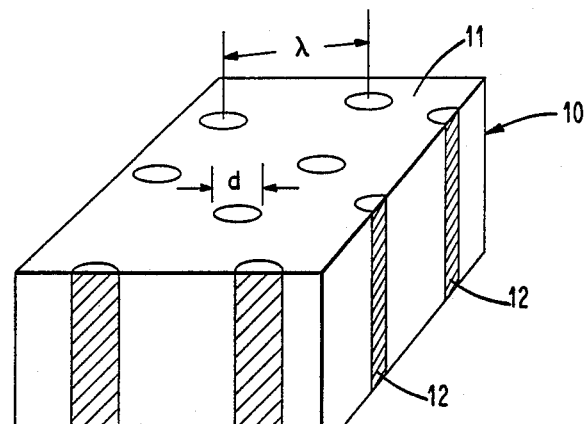
FIG. 1 is a schematic representation of a perspective view taken in cross-section of a fragment of a body which includes a matrix of semiconductor material having conductive rods disposed therein.

FIG. 1 illustrates a fragment of a section or a body 10 cut from a boule grown as above. The body consists essentially of a matrix of semiconductor material 11 and an array of rods 12 of the conductive material which forms the eutectic composition with the semiconductor material. As viewed in FIG. 1, the upper and lower surfaces of the body 10 are a result of cutting the boule transverse to the direction of pulling. The side surfaces are formed by cuts parallel to the rods 12. Each rod 12 extends perpendicularly from the upper surface to the lower surface. The rods 12 are not necessarily of perfect circular cross-section nor are they necessarily perfectly parallel. The rods 12 are, however, each individual elements and do not interconnect, and the semiconductor matrix 11 is entirely interconnected and surrounds each of the individual rods.

The semiconductor material of the melt is appropriately doped with conductivity type imparting material of either N- or P-type so that Schottky barriers are formed between the conductive rods 12 and the semiconductor matrix 11. The carrier concentration in the semiconductor material is from $10^{14}$ to $10^{18}$ cm$^{-3}$. The volume fraction of the rods 12 in the body 10 should be between 0.5 percent and 15 percent. The inter-rod spacing of a composite formed by eutectic solidification is given by $\lambda^2 v$=constant where $\lambda$ is the average inter-rod spacing, v is the growth rate, and the constant is a characteristic of the particular eutectic system. The rod diameter (d) is related to the inter-rod spacing ($\lambda$) by the volume fraction of the rod material as determined by the eutectic phase diagram of the particular eutectic system. For suitable device structures the inter-rod spacing ($\lambda$) should be between 1 and 50 micrometers, and the rod diameter (d) should be between 0.1 and 15 micrometers.

Figure 2:
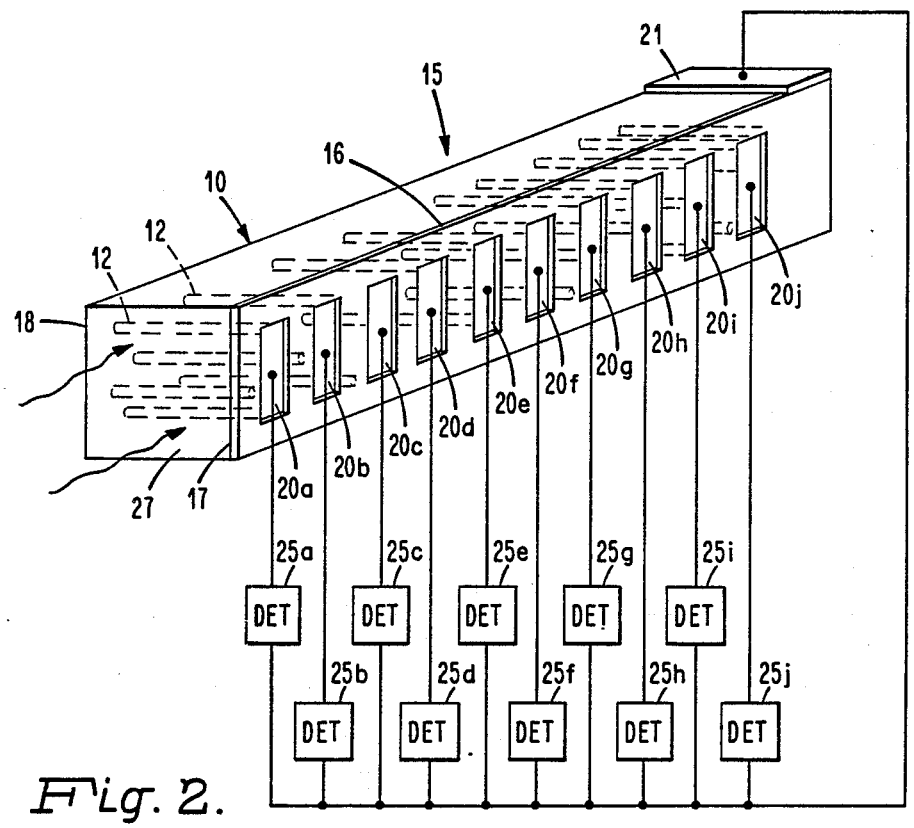
FIG. 2 is a schematic representation in perspective illustrating radiation detecting apparatus in accordance with the present invention.
Figure 3:
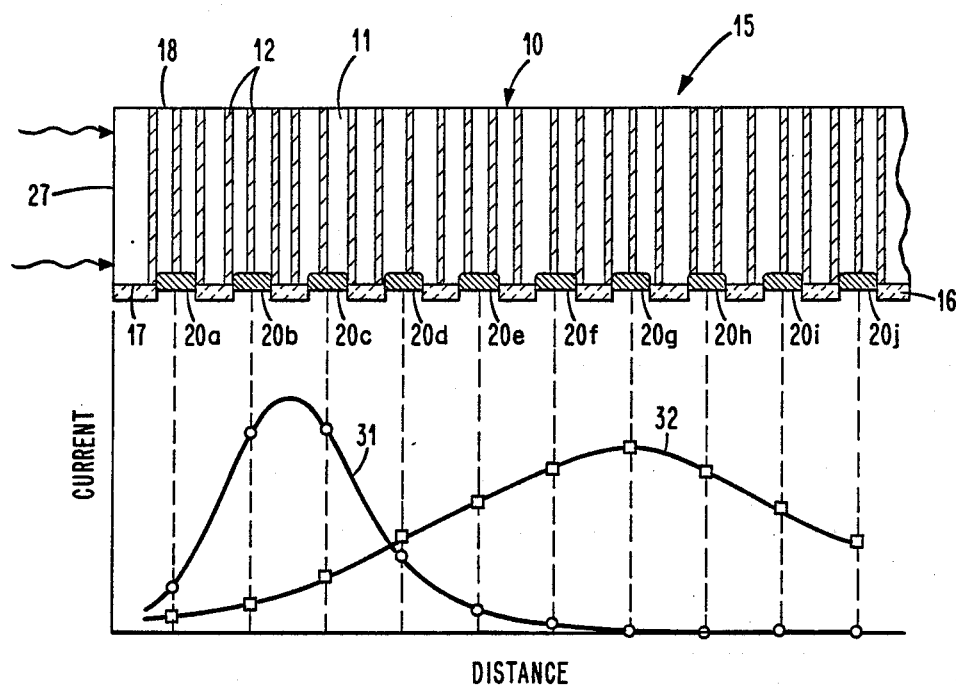
FIG. 3 is a schematic representation of the device of FIG. 2 in plan view taken in cross-section together with a graphical depiction of the electric currents detected in response to incident radiation with different depths of penetration.

The apparatus illustrated in FIG. 2 includes a device 15 fabricated from a body of a eutectic composite 10 as illustrated in FIG. 1. FIG. 3 illustrates the device of FIG. 2 in plan view taken in cross-section. The body 10 of the device is a rectangular parallelepiped; that is, each surface is rectangular, opposite surfaces are parallel, and adjacent surfaces are at right angles. The rods 12 extend perpendicularly to surfaces 17 and 18 and parallel to the other four surfaces. For purposes of discussion the semiconductor matrix 11 is of single crystal silicon with conductive rods 12 of tantalum silicide (TaSi$_2$) grown from a Si-TaSi$_2$ eutectic composition. Examples of other suitable Si-silicide eutectic systems are Si-tungsten silicide, Si-niobium silicide, Si-molybdenum silicide, and Si-zirconium silicide.

By employing conventional techniques of forming silicon oxide layers and standard photolithographic masking and etching techniques an oxide layer 16 having a set of openings therein, each exposing several of the rods 12 at one end thereof, is formed on the surface 17 of the body 10. Conductive contact members 20a-20j are formed in the openings in the silicon oxide layer 16 on the surface 17. In forming the conductive contact members 20a-20j a suitable metal which forms a conductive compound when reacted with silicon and forms a rectifying contact to silicon, specifically cobalt, is deposited over the layer of silicon oxide and the exposed portions of the surface 17 of the body at the openings in the oxide layer. The body is then subjected to a rapid thermal annealing treatment by heating at a temperature of about 800° C. for about 10 seconds to cause the cobalt in contact with silicon to react and form conductive contact members 20a-20j of cobalt disilicide. The cobalt over the silicon oxide does not react and remains as cobalt. This unreacted cobalt is then readily removed by a suitable chemical etch which attacks the cobalt but does not significantly affect the cobalt disilicide or other structural elements of the device.

In the resulting structure, as best illustrated in FIG. 3, each of the cobalt disilicide contact members 20a-20j forms an ohmic contact with the ends of several of the TaSi$_2$ rods 12. The interface of each of the cobalt disilicide contact members 20a-20j with the silicon of the matrix 11 is a Schottky rectifying barrier. The rectifying barrier formed between each contact member 20a-20j and the semiconductor matrix 11 should have a barrier potential which is equal to or higher than the barrier potential of the rectifying barrier between the conductive rods 12 and the semiconductor matrix 11. Platinum silicide has a high potential barrier with N-type silicon and yttrium silicide has a high potential barrier with P-type silicon. Other silicide-forming metals which may be used include nickel, titanium, tantalum, tungsten, and molybdenum.

Each of the contact members 20a-20j is of rectangular configuration and lies parallel to the plane of one of the surfaces 27. This surface 27 is perpendicular to surfaces 17 and 18 and is exposed so as to receive incident radiation. The contact members 20a-20j form a set arranged in order with each succeeding contact member in the order being located at a greater distance from the surface 27.

As illustrated in FIG. 2 another contact member 21 is formed on the body 10. This contact member 21 is in ohmic contact with the silicon 11 of the matrix, and, for example, may be of gold doped with antimony for making ohmic contact to N-type silicon. The contact member 21 also makes contact to some of the rods of the array of rods 12. However, the contact member 21 is located such that these rods are not in contact with any of the set of first contact members 20a-20j. Therefore, they are not active elements of the device and there is no effect on the operation of the device.

Radiation detecting apparatus in accordance with the present invention also includes a set of detectors 25a-25j each of which is connected to a different one of the set of contact members 20a-20j and connected in common to the other contact member 21. The detectors 25a-25j may be any form of detection apparatus which detect the flow of current and/or utilizes the flow of current for any purpose.

The apparatus responds to electromagnetic or particle radiation which impinges on the surface 27 perpendicular to the rods 12. Radiation striking the surface 27 penetrates into the body 10 to a depth determined by the nature of the radiation. Since closely-spaced rectifying barriers are present throughout the body 10, regardless of the depth of penetration absorption of radiation takes place adjacent to a rectifying barrier. Electrical current within the device is generated in the conventional manner. Holes or electrons are produced by the absorption of the radiation in the silicon matrix. The holes or electrons diffuse to the junctions which are nearest and are collected causing current flow through the silicon structure and an external circuit including one of the detector 25a–25j. The distance of diffusion required for collection of the holes or electrons generated by the absorption of the incident radiation is always very small with slight possibility of encountering a recombination center.

The set of contact members 20a–20j each with its group of rods 12, in effect, provides a set of diodes extending along the length of the body 10. Each diode collects only the holes or electrons produced in its immediate vicinity, thus providing a set of distinct detection zones at different depths from the surface 27. Current generated at each of the detection zones as measured by the associated detector 25a–25j can be used to distinguish between different types of radiation if received one at a time, or to determine energy distributions and numbers of particles for each type when several types are received at the same time. FIG. 3 illustrates graphically the current values which might be measured by each of the detectors 25a–25j and curves 31 and 32 produced from the current measurements in response to radiation with a short penetration depth and radiation with a long penetration depth, respectively.

Radiation detecting apparatus in accordance with the present invention may employ a device 15 fabricated from a Si-TaSi$_2$ eutectic composite, which may be produced in accordance with the teachings in application Ser. No. 940,371, filed Dec. 11, 1986, by Brian M. Ditchek, entitled "Method of Producing a Semiconductor Device" and assigned to the assignee of the present application. The Si-TaSi$_2$ eutectic composite is grown directly from a melt in a Czochralski crystal growth furnace in accordance with Czochralski crystal pulling techniques. A charge of silicon and tantalum is placed in a quartz crucible with a graphite susceptor. The tantalum is 5.5% by weight of the charge, providing the mole ratio of silicon to tantalum in the Si-TaSi$_2$ eutectic composition. The silicon in the charge is doped with phosphorus. After rf heating the charge to above the eutectic temperature and obtaining charge homogenization, a (111) orientation silicon seed crystal is lowered onto the melt surfac.. Composite boules are pulled from the melt at a growth rate (v) of 20 cm/h in a flowing argon atmosphere. A boule is produced having a silicon matrix phase of single crystal (111) orientation free of grain boundaries. The boule is 2% by volume of conductive, metallic, TaSi$_2$ rods. At a transverse-cut surface 17 the composite contains $1.6 \times 10^6$ TaSi$_2$ rods/cm$^2$ with an average rod diameter (d) of 1.2 micrometers. The average inter-rod spacing ($\lambda$) is 7.9 micrometers.

Devices are fabricated from 1 centimeter thick slices of the boule. A 0.2 micrometer thick silicon oxide coating is grown on one major surface of the slice in which one ends of the rods are exposed. Conventional processing techniques are employed to form rectangular openings in the oxide coating. For incident radiation with an absorption coefficient of about 10 cm$^1$ the openings would be approximately 1 cm by 0.01 cm with a spacing of 0.01 cm between openings. Cobalt disilicide contact members 20a–20j are formed in the openings in accordance with the teachings in application Ser. No. 940,700, filed Dec. 11, 1986, by Brian M. Ditchek entitled "Method of Making Electrical Contacts" and assigned to the assignee of the present application. The cobalt disilicide provides ohmic metallic contacts to the exposed ends of the TaSi$_2$ rods of each group while forming Schottky barriers with the silicon of the matrix. The Schottky barriers between the cobalt disilicide and the silicon have a higher barrier potential than the Schottky barriers between the TaSi$_2$ rods and silicon.

Based on the area of each of the cobalt disilicide contact members 20a–20j and the rod density in the matrix, each zone of a device contains about 10$^4$ rods. An individual device has a body 1 cm by 1 cm by 0.4 cm cut from a slice. An ohmic contact 21 is formed on a surface of the body adjacent to an edge so as to be spaced from the detection zones as illustrated in FIG. 2. The contact member 21 is formed by depositing and alloying a gold-antimony film.

Radiation detection devices in accordance with the present invention as described are efficient over a wider spectral range than conventional planar devices. The conductive rods are disposed throughout the silicon matrix so as to provide closely-spaced junctions throughout the bulk of the device. Thus, nearly the entire volume of the device is utilized to collect charge carriers produced by incident radiation. Charge carriers generated by the absorption of radiant energy are never more than a very short distance from a junction regardless of their depth of penetration into the bulk of the device. In the specific devices described, the distance is no more than 5 micrometers. Therefore, charge carriers are collected with essentially equal efficiency over a large range of depths with reduced possibilities of encountering recombination centers. The arrangement as shown permits measuring the amount of radiation penetrating to each zone. The apparatus can thus be used to distinguish between different types of particles or to determine energy distributions and numbers of incident particles.

While there has been shown and described what is considered a preferred embodiment of the present invention, it will be obvious to those skilled in the art that various changes and modifications may be made therein without departing from the invention as defined by the appended claims.

What is claimed is:

1. A radiation detecting device comprising
   a body including a matrix of semiconductor material having disposed therein an array of individual rods of conductive material forming rectifying barriers at the interfaces of the rods and the semiconductor material;
   a set of first conductive contact members at a first surface of said body, each first conductive contact member of the set being in ohmic contact with a different plurality of said rods at one end of each of the rods of the associated plurality;
   a second conductive contact member in ohmic contact with the semiconductor material of said matrix; and
   said body being adapted to receive incident radiation at a portion of a second surface lying generally transverse to said first surface.

2. A radiation detecting device in accordance with claim 1 wherein
   said body includes a matrix of single crystal semiconductor material; and
   the conductive material of said rods is a conductive compound of a metal and the semiconductor material of the matrix or of a metal and a constituent element of the semiconductor material.

3. A radiation detecting device in accordance with claim 2 wherein charge carriers are produced by the absorption of radiation in the body and are collected at the rectifying barriers of adjacent rods; and said set of first conductive contact members are arranged in order along said first surface of the body with each of said first conductive contact members being spaced in order at a greater distance from said second surface of the body so that the plurality of rods associated with each of said first conductive contact members collects charge carriers at the rectifying barriers thereof which are produced by radiation which penetrates to a different depth into the body from said second surface.

4. A radiation detecting device in accordance with claim 3 wherein each of said first conductive contact members is in ohmic contact with each of said rods of the associated plurality and in rectifying contact with semiconductor material of said matrix at said first surface of the body.

5. A radiation detecting device comprising a body including a matrix of semiconductor material having disposed therein an array of individual rods of conductive material forming rectifying barriers at the interfaces of the rods and the semiconductor material;

said rods of said array being disposed generally parallel to each other and transverse to a first surface of said body with each of said rods having one end thereof at said first surface;

a set of first conductive contact members at said first surface, each first conductive contact member of the set being in ohmic contact with a different plurality of said rods at said one end of each of the rods of the associated plurality;

a second conductive contact member in ohmic contact with the semiconductor material of said matrix; and a second surface of said body generally transverse to said first surface and generally parallel to said rods adapted to receive incident radiation.

6. A radiation detecting device in accordance with claim 5 wherein said rods of said array are distributed throughout said body;

said body includes a matrix of single crystal semiconductor material; and the conductive material of said rods is a conductive compound of a metal and the semiconductor material of the matrix or of a metal and a constituent element of the semiconductor material.

7. A radiation detecting device in accordance with claim 6 wherein charge carriers are produced by the absorption of radiation in the body and are collected at the rectifying barriers of adjacent rods; and said set of first conductive contact members are arranged in order along said first surface of the body with each of said first conductive contact members being spaced in order at a greater distance from said second surface of the body so that the plurality of rods associated with each of said first conductive contact members collects charge carriers at the rectifying barriers thereof which are produced by radiation which penetrates to a different depth into the body from said second surface.

8. A radiation detecting device in accordance with claim 7 wherein the conductive compound and the semiconductor material are the constitutents of a eutectic composition; and the mole ratio of semiconductor material to the metal in the matrix and array of rods is approximately equal to the mole ratio of the semiconductor material to the metal in the eutectic composition of the semiconductor material and the conductive compound.

9. A radiation detecting device in accordance with claim 8 wherein each of said first conductive contact members is in ohmic contact with each of said rods of the associated plurality and in rectifying contact with semiconductor material of said matrix at said first surface of the body.

10. A radiation detecting device in accordance with claim 9 wherein the volume fraction of the array of rods of the conductive compound in the body is from 0.5 to 15 percent.

11. A radiation detecting device in accordance with claim 10 wherein the semiconductor material is selected from the group consisting of silicon, germanium, III-V compound semiconductor materials, and II-VI compound semiconductor materials.

12. A radiation detecting device in accordance with claim 11 wherein said first and second surfaces are substantially planar and perpendicular to each other; and each of said first conductive contact members of said set is of generally rectangular configuration and oriented generally parallel to said second surface.

13. A radiation detecting device in accordance with claim 12 wherein said semiconductor material is silicon; and said metal is selected from the group consisting of tantalum, tungsten, niobium, molybdenum, and zirconium.

14. A radiation detecting device in accordance with claim 13 wherein the diameter of each of said rods is from 0.1 to 15 micrometers; and the spacing between adjacent rods is from 1 to 50 micrometers.

15. Radiation detecting apparatus comprising a body including a matrix of semiconductor material having disposed therein an array of individual rods of conductive material forming rectifying barriers at the interfaces of the rods and the semiconductor material;

a set of first conductive contact members at a first surface of said body, each first conductive contact member of the set being in ohmic contact with a different plurality of said rods at one end of each of the rods of the associated plurality;

a second conductive contact member in ohmic contact with the semiconductor material of said matrix;

said body having a second surface generally transverse to said first surface adapted to receive incident radiation so that charge carriers are produced by the absorption of radiation in the body and are collected at the rectifying barriers of adjacent rods; and a set of current detecting means, each current detecting means being connected to a different one of said set of first conductive contact members and each being connected to said second conductive contact member, each current detecting means being operable to detect the flow of electrical current generated by the collection of charge carriers at the rectifying barriers of the plurality of rods in contact with the first conductive contact member to which the current detecting means is connected.

16. Radiation detecting apparatus in accordance with claim 15 wherein
said body includes a matrix of single crystal semiconductor material; and
the conductive material of said rods is a conductive compound of a metal and the semiconductor material of the matrix or of a metal and a constituent element of the semiconductor material.

17. Radiation detecting apparatus in accordance with claim 16 wherein
said set of first conductive contact members are arranged in order along said first surface of the body with each of said first conductive contact members being spaced in order at a greater distance from said second surface of the body so that the plurality of rods associated with each of said first conductive contact members collects charge carriers at the rectifying barriers thereof which are produced by radiation which penetrates to a different depth into the body from said second surface.

18. Radiation detecting apparatus in accordance with claim 17 wherein
each of said first conductive contact members is in ohmic contact with each of said rods of the associated plurality and in rectifying contact with semiconductor material of said matrix at said first surface of the body.

19. Radiation detecting apparatus comprising
a body including a matrix of semiconductor material having disposed therein an array of individual rods of conductive material forming rectifying barriers at the interfaces of the rods and the semiconductor material;
said rods of said array being disposed generally parallel to each other and transverse to a first surface of said body with each of said rods having one end thereof at said first surface;
a set of first conductive contact members at said first surface, each first conductive contact member of the set being in ohmic contact with a different plurality of said rods at said one end of each of the rods of the associated plurality;
a second conductive contact member in ohmic contact with the semiconductor material of said matrix;
a second surface of said body generally transverse to said first surface and generally parallel to said rods adapted to receive incident radiation so that charge carriers are produced by the absorption of radiation in the body and are collected at the rectifying barriers of adjacent rods; and
a set of current detecting means, each current detecting means being connected to a different one of said set of first conductive contact members and each being connected to said second conductive contact member, each current detecting means being operable to detect the flow of electrical current generated by the collection of charge carriers at the rectifying barriers of the plurality of rods in contact with the first conductive contact member to which the current detecting means is connected.

20. Radiation detecting apparatus in accordance with claim 19 wherein
said rods of said array are distributed throughout said body;
said body includes a matrix of single crystal semiconductor material; and
the conductive material of said rods is a conductive compound of a metal and the semiconductor material of the matrix or of a metal and a constituent element of the semiconductor material.

21. Radiation detecting apparatus in accordance with claim 20 wherein
said set of first conductive contact members are arranged in order along said first surface of the body with each of said first conductive contact members being spaced in order at a greater distance from said second surface of the body so that the plurality of rods associated with each of said first conductive contact members collects charge carriers at the rectifying barriers thereof which are produced by radiation which penetrates to a different depth into the body from said second surface.

22. Radiation detecting apparatus in accordance with claim 21 wherein
the conductive compound and the semiconductor material are the constituents of a eutectic composition; and
the mole ratio of semiconductor material to the metal in the matrix and array of rods is apparoximately equal to the mole ratio of the semiconductor material to the metal in the eutectic composition of the semiconductor material and the conductive compound.

23. Radiation detecting apparatus in accordance with claim 19 wherein
each of said first conductive contact members is in ohmic contact with each of said rods of the associated plurality and in rectifying contact with semiconductor material of said matrix at said first surface of the body.

24. Radiation detecting apparatus in accordance with claim 23 wherein
the volume fraction of the array of rods of the conductive compound in the body is from 0.5 to 15 percent.

25. Radiation detecting apparatus in accordance with claim 24 wherein
the semiconductor material is selected from the group consisting of silicon, germanium, III-V compound semiconductor materials, and II-VI compound semiconductor materials.

26. Radiation detecting apparatus in accordance with claim 25 wherein
said first and second surfaces are substantially planar and perpendicular to each other; and
each of said first conductive contact members of said set is of generally rectangular configuration and oriented generally parallel to said second surface.

27. Radiation detecting apparatus in accordance with claim 26 wherein
said semiconductor material is silicon; and
said metal is selected from the group consisting of tantalum, tungsten, niobium, molybdenum, and zirconium.

28. Radiation detecting apparatus in accordance with claim 27 wherein
the diameter of each of said rods is from 0.1 to 15 micrometers; and
the spacing between adjacent rods is from 1 to 50 micrometers.

* * * * *